(12) United States Patent
Jimarez et al.

(10) Patent No.: US 6,664,637 B2
(45) Date of Patent: Dec. 16, 2003

(54) FLIP CHIP C4 EXTENSION STRUCTURE AND PROCESS

(75) Inventors: Miguel Angel Jimarez, Newark Valley, NY (US); Cynthia Susan Milkovich, Vestal, NY (US); Mark Vincent Pierson, Binghamton, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/756,062

(22) Filed: Jan. 8, 2001

(65) Prior Publication Data

US 2001/0005047 A1 Jun. 28, 2001

Related U.S. Application Data

(62) Division of application No. 09/309,405, filed on May 10, 1999.

(51) Int. Cl.$^7$ .......................... H01L 23/06; H01L 23/48; H01L 23/29
(52) U.S. Cl. ................. 257/772; 257/779; 257/777; 257/781; 257/737; 257/738; 257/729; 257/731; 257/747; 257/783; 257/788; 257/789; 257/792
(58) Field of Search ................. 257/772, 779, 257/780, 781, 737, 738, 729, 731, 747, 783, 788, 789, 792, 777; 438/108, 614; 174/261; 228/56.3

(56) References Cited

U.S. PATENT DOCUMENTS

| | | | |
|---|---|---|---|
| 4,376,505 A | | 3/1983 | Wojcik |
| 5,060,844 A | | 10/1991 | Behun et al. |
| 5,147,084 A | * | 9/1992 | Behun et al. ............. 228/56.3 |

(List continued on next page.)

FOREIGN PATENT DOCUMENTS

| | | |
|---|---|---|
| JP | 06-61303 | 3/1994 |
| JP | 06-177205 | 6/1994 |
| JP | 06-350250 | 12/1994 |

(List continued on next page.)

OTHER PUBLICATIONS

Richard J Lewis, Sr, Hawley's Condensed Chemical Dictionary, Van Nostrand Reihold Company, Twelfth Edition, p. 1036.*

*Primary Examiner*—Eddie Lee
*Assistant Examiner*—Joseph Nguyen
(74) *Attorney, Agent, or Firm*—Schmeiser, Olsen & Watts; Arthur J. Samodovitz

(57) ABSTRACT

An electrical structure, and associated method of fabrication, for reducing thermally induced strain in a conductive structure that couples a first substrate to a second substrate. The first substrate may include a chip or a module. The second substrate may include a chip carrier or a circuit card. Thus, the present invention encompasses such coupling as chip to chip carrier, chip to circuit card, and module to circuit card. The conductive structure includes a first conductive body and a second conductive body. The first conductive body is attached to the first substrate and the second conductive body is attached to the second substrate. The first conductive body may include a solder bump, while the second conductive body may include a eutectic alloy, such as a eutectic alloy lead and tin. Alternatively, the second conductive body may include a non-eutectic alloy whose melting point is below the melting point of the first conductive body. A portion of the first conductive body is coated with a material that is nonsolderable and nonconductive. The melting point of the first conductive body is higher than the melting point of the second conductive body. The first and second conductive bodies are coupled mechanically and electrically by surface adhesion at an uncoated surface of the first conductive body. The adhesive coupling results from application of a temperature that lies between the melting points of the first and second conductive bodies.

26 Claims, 11 Drawing Sheets

U.S. PATENT DOCUMENTS

| | | | | |
|---|---|---|---|---|
| 5,371,328 A | * | 12/1994 | Gutierrez et al. | 174/261 |
| 5,542,601 A | * | 8/1996 | Fallon et al. | |
| 5,616,520 A | | 4/1997 | Nishiuma et al. | |
| 5,639,696 A | | 6/1997 | Liang | |
| 5,640,052 A | * | 6/1997 | Tsukamoto | 257/781 |
| 5,641,113 A | | 6/1997 | Somaki et al. | |
| 5,656,862 A | | 8/1997 | Papathomas et al. | |
| 5,729,440 A | * | 3/1998 | Jimarez et al. | 361/779 |
| 5,730,607 A | | 3/1998 | Darty | |
| 5,751,068 A | | 5/1998 | McMahon et al. | |
| 5,773,889 A | * | 6/1998 | Love et al. | 257/737 |
| 5,790,377 A | * | 8/1998 | Schreiber et al. | 361/704 |
| 5,797,591 A | | 8/1998 | Dalal | |
| 5,869,904 A | * | 2/1999 | Shoji | 257/779 |
| 5,903,058 A | * | 5/1999 | Akram | 257/778 |
| 5,912,505 A | * | 6/1999 | Itoh et al. | 257/737 |
| 5,953,623 A | | 9/1999 | Boyko | |
| 5,964,396 A | | 10/1999 | Brofman | |
| 5,968,670 A | | 10/1999 | Brofman | |
| 5,975,409 A | | 11/1999 | Brofman | |
| 6,059,173 A | | 5/2000 | Mays | |
| 6,125,043 A | * | 9/2000 | Hauer et al. | 361/760 |
| 6,136,047 A | * | 10/2000 | Karasawa et al. | 29/25.01 |

FOREIGN PATENT DOCUMENTS

| | | |
|---|---|---|
| JP | 08-17860 | 1/1996 |
| JP | 10-098045 | 4/1998 |
| JP | 10-107081 | 4/1998 |
| JP | 10-303245 | 11/1998 |
| JP | 11-168116 | 6/1999 |
| JP | 11-330126 | 11/1999 |

* cited by examiner

FLIP CHIP C4 EXTENSION STRUCTURE AND PROCESS

This application is a divisional of Ser. No. 09/309,405, filed on May 10, 1999.

BACKGROUND OF THE INVENTION

1. Technical Field

The present invention relates to an electrical structure, and associated method of fabrication, that reduces thermally induced strain in solder joints that couple a first substrate to a second substrate. The first substrate may include a chip or a module. The second substrate may include a chip carrier or a circuit card. Thus, the present invention encompasses such coupling as chip to chip carrier, chip to circuit card, and module to circuit card.

2. Related Art

A well-known method for coupling a chip to a chip carrier is that of controlled collapse chip connection ("C4") in which a C4 solder ball couples a chip to a chip carrier. The C4 solder ball is coupled to a pad on the chip and the C4 solder ball is connected to the chip carrier by use of a solder joint at a solderable site on the chip carrier. The C4 solder ball has any composition that is well known in the art, and typically comprises an alloy of lead and tin in such high lead/tin ratios as 90/10 or 97/3 by weight. Another C4 solder ball composition is a lead/indium alloy in a 50/50 ratio by weight.

When the above structure is heated or cooled, the solder joint is subject to strains that arise from the differential rate of thermal expansion of the chip and the chip carrier. For example, a chip typically comprises silicon and has a coefficient of thermal expansion ("CTE") of about 3 to 6 ppm/° C. (ppm denotes parts per million). The chip carrier is typically a laminate comprising alumina or a laminate comprising an organic material. A alumina chip carrier has a CTE of about 6 ppm/° C., while an organic chip carrier has a CTE in the range of about 6 to 24 ppm/° C. The thermal stresses and consequent strains resulting from the CTE mismatch during thermal cycling may cause fatigue failure in the solder joint and consequent reduction in reliability as measured by the number of cycles that can be achieved prior to fatigue failure.

A method in the prior art for mitigating the effect of the CTE mismatch on fatigue life is filling the space between the chip and the chip carrier with a material that encapsulates the interconnecting structure, including the C4solder ball, that joins the chip to the chip carrier, as described in U.S. Pat. No. 5,656,862 (Papathomas et al., Aug. 12, 1997, hereby incorporated by by reference). The encapsulating material typically has a CTE of about 24 to 40 ppm/° C. and causes the whole structure to move as one composite structure during thermal cycling. The high stiffness of the encapsulating material enables the encapsulating material to accommodate the thermal stresses that would otherwise act at the solder joint. A material that may be used for this purpose is Hysol 45121 which has a stiffness of about $10^6$ psi. A problem with using encapsulating material is that conditions, such as contamination or fracture of the encapsulating material, may prevent the encapsulating material from adequately adhering to the interconnecting structure. The resulting separation of the encapsulating material exposes the interconnecting structure, thereby negating the encapsulating material's role of reducing thermal stresses. Another difficulty is that the high encapsulant stiffness needed for effectively relieving thermal stresses unfortunately generates mechanical stresses on the interconnecting structure that may be high enough to weaken the structural integrity of the interconnecting structure. As the encapsulant stiffness diminishes, the mechanical stresses on the interconnecting structure decrease and the ability of the encapsulant to absorb shock and vibration increases. An additional consideration is that the encapsulating material interferes with reworkability of the chip-to-chip carrier structure for correcting a problem arising during the life cycle and testing phases of the structure.

Another method in the prior art for mitigating the effect of the CTE mismatch on fatigue life is a process disclosed in U.S. Pat. No. 5,641,113 (Somaki et al., Jun. 24, 1997, hereby incorporated by by reference). Somaki discloses coupling a chip to a substrate by fusing together a first solder bump truncated sphere and a second solder bump truncated sphere. The fusing occurs after a first process and before a second process. The first process includes forming and connecting the first solder bump to the chip, coating the first solder bump with a non-conductive resin that is liquid at room temperature prior to being hardened, hardening the resin layer, and removing a portion of the resin layer so as to expose a surface of the first solder bump that will be fused with the second solder bump. After the first process, the fusing is accomplished by reflowing the first solder bump and second solder bump at a temperature that causes both the first solder bump and the second solder bump to melt and fuse together. Then the second process joins the second solder bump to the substrate. Unfortunately, this method is not practical for reworking the chip-to-substrate structure for correcting problems arising during the life cycle and testing phases of the structure. The reworkability is problematic, because the application of heat to decouple the fused first and second solder bumps will melt both the first and second solder bumps. As the chip and the substrate are pulled apart, molten solder will flow out of the resin layer leaving a partially or fully empty resin shell attached to the chip. This resultant chip configuration cannot be reworked at a practical cost and the chip has consequently become unusable.

There is a need for a method of reducing the thermal stresses that facilitates reworkability, eliminates the need for encapsulating material or enables an encapsulant of diminished stiffness to be used.

SUMMARY OF THE INVENTION

The present invention provides a first electrical structure of a first substrate coupled to a second substrate. A first conductive body is mechanically and electrically coupled to the first substrate. A nonsolderable and nonconductive coating material coats a portion of a surface of the first conductive body such that an uncoated surface remains. A second conductive body is mechanically and electrically coupled, by surface adhesion, to the uncoated surface of the first conductive body. The melting point of the second conductive body is less than the melting point of the first conductive body. The melting point is defined as the minimum temperature at which a substance melts. The second conductive body is mechanically and electrically coupled to the second substrate.

The present invention provides a second electrical structure of a first substrate coupled to a second substrate. A first conductive body is mechanically and electrically coupled to the first substrate. A nonsolderable and nonconductive coating material coats a portion of a surface of the first conductive body such that an uncoated surface remains. The electrical structure also includes means for mechanically and electrically coupling a second conductive body to the first conductive body by surface adhesion. The coupling means includes means for applying a temperature to the first conductive body and the second conductive body, wherein the temperature is below a melting point of the first conductive body and above a melting point of the second conductive body. The second conductive body is mechanically and electrically coupled to the second substrate.

The present invention provides a method for forming an electrical structure, comprising the steps of:

providing a first structure, including a first substrate, a first conductive body mechanically and electrically coupled to the first substrate, and a coat of nonsolderable and nonconductive material, wherein a portion of a surface of the first conductive body is coated by the coat of nonsolderable and nonconductive material such that an uncoated surface of the first conductive body remains;

providing a second structure, including a second substrate and a conductive bump mechanically and electrically coupled to the second substrate;

placing the second structure in contact with the first structure such that the conductive bump is in contact with the uncoated surface of the first conductive body;

reflowing the conductive bump without melting any portion of the first conductive body to form a second conductive body, wherein the second conductive body covers the uncoated surface of the first conductive body; and cooling the first structure and the second structure to solidify the second conductive body and to mechanically and electrically couple the second conductive body to the first conductive body by surface adhesion at the uncoated surface of the first conductive body.

The present invention provides a method of forming a solder column, comprising the steps of:

providing a structure, including:
  a substrate having an attached pad,
  a solder body in contact with the pad, and
  a retractable object having a solderable surface in contact with the solder body;

heating the structure to a temperature above the melting point of the solder body;

moving the retractable object away from the pad while the solder body is solderably connected to both the both pad and the solderable surface, until the solder column is formed from the solder body;

cooling the solder column; and detaching the retractable object from the solder column after the solder column has solidified.

The present invention has the advantage of increasing the fatigue life (i.e. decreasing the number of thermal cycles prior to fatigue failure) of the electrical structure by reducing thermally-induced strain on solder joints within the structure.

The present invention has the advantage of either not requiring encapsulating material or reducing the required stiffness of the encapsulating material.

The present invention has the advantage of being easily reworkable to correct problems occurring during the life cycle and testing phases of the electrical structure. The reworkability results from the ability to easily eliminate the surface adhesion between the first and second conductive bodies by applying heat at a temperature that melts the second conductive body but does not melt the first conductive body. The ability to rework the electrical structure without causing irreversible or expensive damage also facilitates the practicality of attaching a chip directly to a circuit card, which would eliminate the need for a chip carrier. Hence, the substrate of the present invention may comprise either a chip carrier or a circuit card.

The present invention has the advantage of providing a practical method of forming a solder column by using the movement of a retractable object to form the length and shape of the solder column.

DETAILED DESCRIPTION OF THE INVENTION

Figure 1:
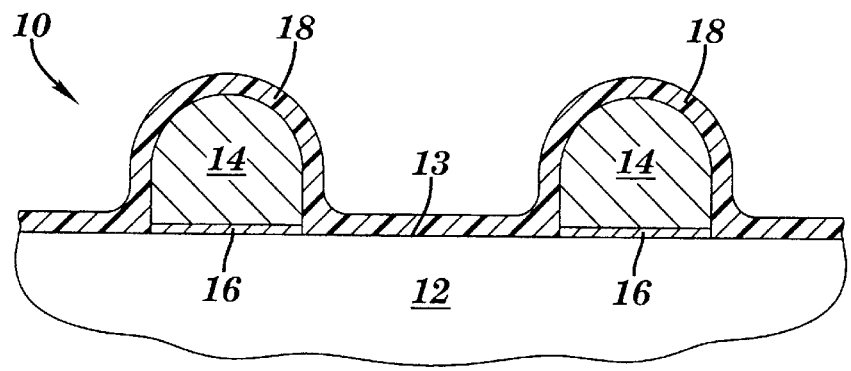
FIG. 1 depicts a front cross-sectional view of a first structure, in accordance with a first preferred embodiment of the present invention.

FIGS. 1–8 illustrate the process steps associated with a first preferred embodiment of the present invention, FIG. 1 depicts a front cross-sectional view of a first structure 10, which has two pads 16 on a top surface 13 of a first substrate 12. A conductive body 14 is on each pad 16. While two pads 16 and two associated first conductive bodies 14 are shown, the first structure 10 may include any number of first conductive bodies 14 placed on the same number of pads 16. The first substrate 12 may comprise a chip or a module. Each first conductive body 14 may comprise a solder bump, such as a solder bump formed by a known process such as controlled collapse chip connection ("C4"). If the substrate 12 comprises a module, then each first conductive body 14 may comprise a ball of a ball grid array ("BGA"). Each first conductive body 14 comprises a suitable solder such as an alloy of lead and tin in such concentrations that the melting point of the alloy is clearly above the melting point of the eutectic alloy. For example, each first conductive body 14 may have a lead/tin ratio of 90/10 by weight which has a melting point of about 327–330° C. In contrast, the eutectic lead/tin ratio of about 63/37 by weight has a melting point of about 183° C. Each first conductive body 14 may have any suitable shape and size that is characteristic of the size and shape of a solder bump, or ball of a BGA module. For example, each first conductive body 14 may be a truncated sphere having a 5-mil diameter and a 4-mil height.

Figure 2:
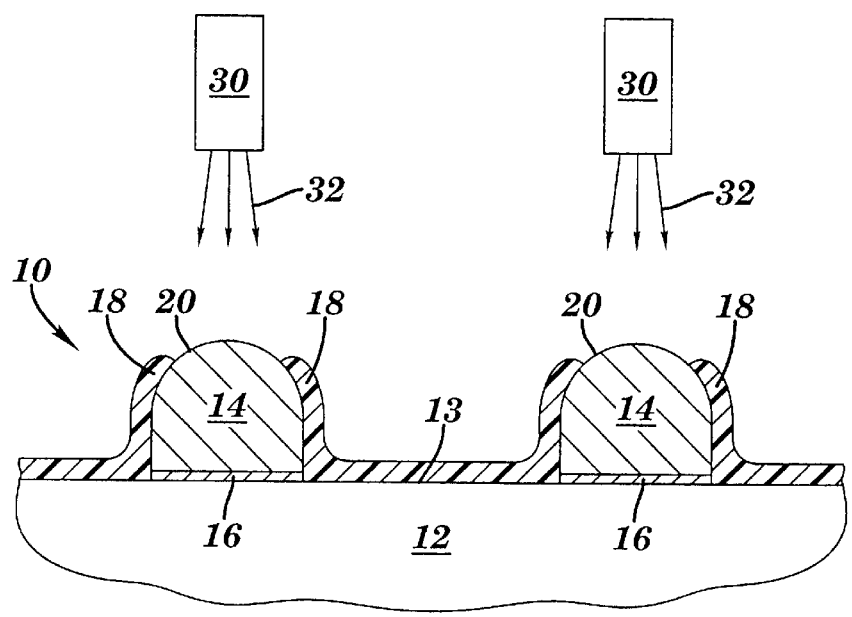
FIG. 2 depicts FIG. 1 after a portion of the coat of material of the first structure has been removed by laser ablation.
Figure 3:
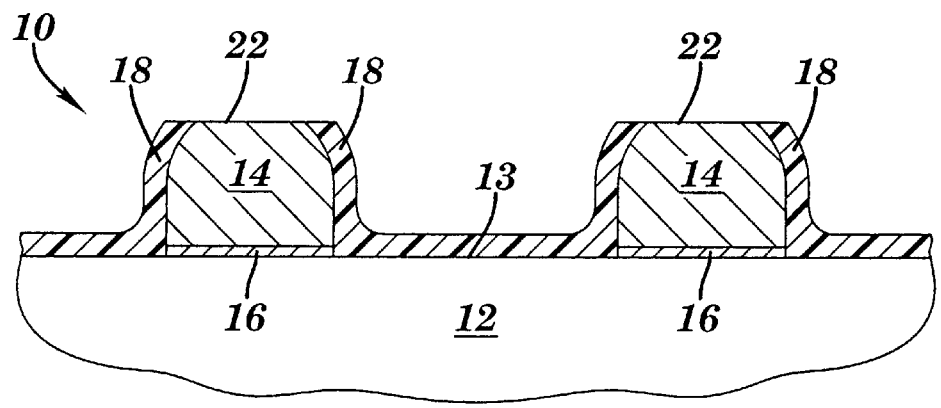
FIG. 3 depicts FIG. 1 after a portion of the coat of material of the first structure has been removed by grinding.
Figure 4:
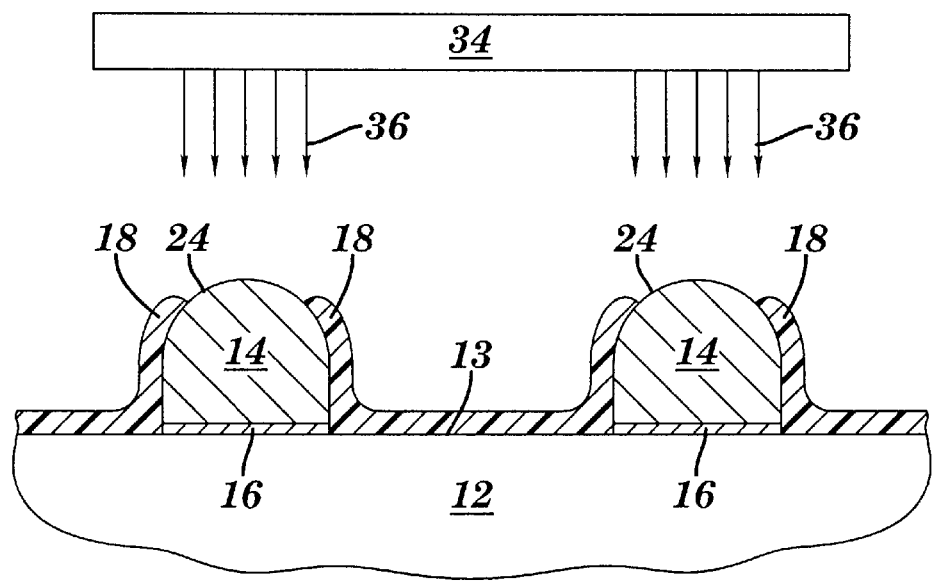
FIG. 4 depicts FIG. 1 after a portion of the photosensitive coat of material of the first structure has been developed away.

FIG. 1 shows the first conductive bodies 14, and the top surface 13, covered by a coat of material 18. The coat of material 18 comprises a nonsolderable and nonconductive material such as a polyimide or a photosensitive resin. An example of a suitable polyimide is Dupont PI5878 material. An example of a suitable photosensitive resin is Taiyo PSR 4000-SP50 material. A polyimide layer may be formed by any suitable method known in the art, such as by spin coating or spraying. The top surface 13 and first conductive bodies 14 may be cleaned and surface roughened prior to forming the coat of material 18, using standard techniques such as plasma treatment, to improve the surface adhesion of the coat of material 18 to the top surface 13 and first conductive bodies 14. For a material 18 such as a polyimide, FIG. 2 shows the result of applying radiation 32 from lasers 30 to remove a portion of the coat of material 18 to form uncoated surfaces 20. The laser ablation process may also remove a small amount of material (e.g., a quarter-mil height) from each first conductive body 14. As an alternative to applying laser ablation, FIG. 3 shows the result of grinding away a portion of the coat of material 18 and some material from each first conductive body 14 to form a flat uncoated surface 22 on each first conductive body 14. If the coat of material 18 is a photosensitive resin, FIG. 4 shows uncoated surfaces 24 formed as a result of applying light of a suitable wavelength 36 from light sources 34, in conjunction with a photomask, to the photosensitive coat of material 18. Following photoexposure, photosensitive material is developed away where it unwanted; i.e., at uncoated surfaces 24. The uncoated surfaces 26 in FIGS. 7 and 8 (to be discussed infra) represents the uncoated surface of the first conductive bodies 14, regardless of the method used (e.g., laser ablation, grinding, photolithography as depicted in FIGS. 2, 3, and 4, respectively) to form the uncoated surfaces 26. The uncoated surface 26 may be cleaned and surface roughened, using standard techniques such as plasma treatment, to improve the subsequent surface adhesion with conductive bump 44, as will be discussed infra for FIGS. 7–8.

Figure 5:
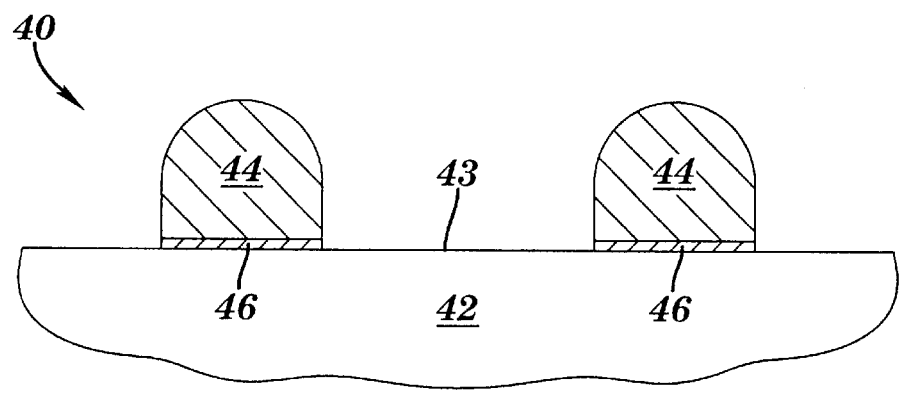
FIG. 5 depicts a front cross-sectional view of a second structure, in accordance with the first preferred embodiment of the present invention.

FIG. 5 depicts a front cross-sectional view of a second structure 40, which has two pads 46 on a top surface 43 of a second substrate 42. A conductive bump 44, such as a C4 eutectic solder bump in the form of a pre-cleaned solder ball, is located on each pad 46. While two pads 46 and two associated conductive bumps 44 are shown, the second structure 40 may include any number of conductive bumps 44 placed on the same number of pads 46. If the first substrate 12 of FIG. 1 comprises a chip, then the second substrate 42 may comprise a chip carrier or a circuit card. If the first substrate 12 of FIG. 1 is a module, then the second substrate 42 may comprise a circuit card. Other structural combinations of the first structure and the second structure are also possible. The melting point of the conductive bumps 44 are below the melting point of the first conductive bodies 14 (see FIG. 1). For example, if the first conductive bodies 14 comprise a lead/tin alloy of 90/10 composition by weight (melting point 327–330° C.), then the conductive bumps 44 may comprise the eutectic 63/37 lead/tin alloy (melting point 183° C.), with a consequential melting point differential of more than 140° C. It is also within the scope of the present invention for the conductive bumps 44 to comprise an alloy of a composition that has a melting point above the eutectic melting point. In this regard, the respective melting points of a conductive bump 44 and an associated first conductive body 14 must be related such that the conductive bump 44 and the associated first conductive body 14 may be heated to a common temperature at which the conductive bump 44 melts and reflows while the associated first conductive body 14 remains solid. The conductive bumps 44 may be any suitable shape and size, such as a truncated spherical shape with a diameter of 1 to 40 mils.

Figure 6:
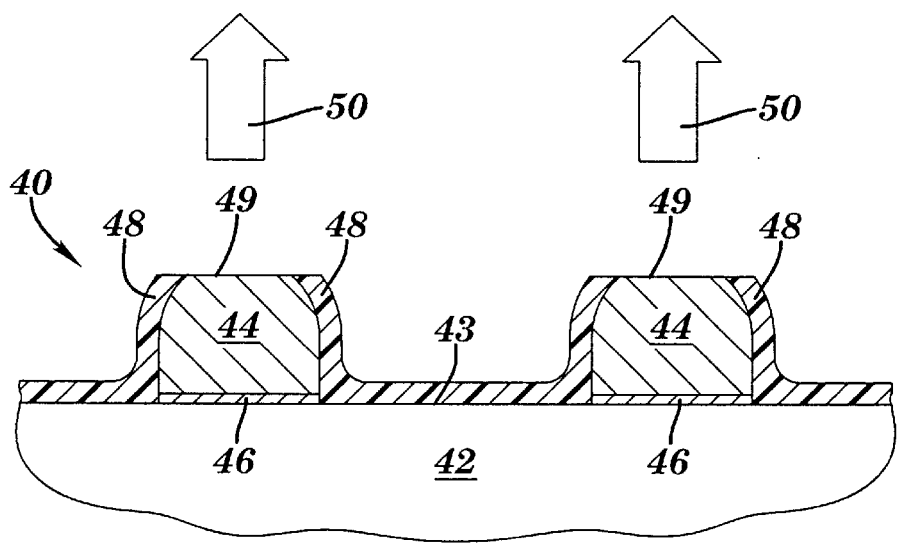
FIG. 6 depicts FIG. 5 with a coat of material on the conductive bumps of the second structure.

FIG. 6 shows conductive bumps 44, and the top surface 43, covered by a coating of material 48, such as cured photosensitive resin. In FIG. 6, an uncoated surface 49 of each conductive bump 44 may be formed by any of the methods by which the uncoated surfaces of the first conductive bodies 14 are formed, such as laser ablation, grinding, and photolithography, as discussed supra with FIGS. 2, 3, and 4, respectively. The top surface 43 may be cleaned and surface roughened prior to forming the coating of material 48, using standard techniques such as plasma treatment, to improve the surface adhesion of the coat of material 48 to the top surface 43 The coating of material 48 in FIG. 6 is optional and serves to constrain the conductive bump material 44 to move, upon being reflowed, in an approximately upward direction, as denoted by direction arrow 50, rather than in a sidewise direction. Thus, by preventing sidewise motion of the conductive bump material 44, the coating of material 48 inhibits a reduction in height of the conductive bumps 44 during reflow.

Figure 7:
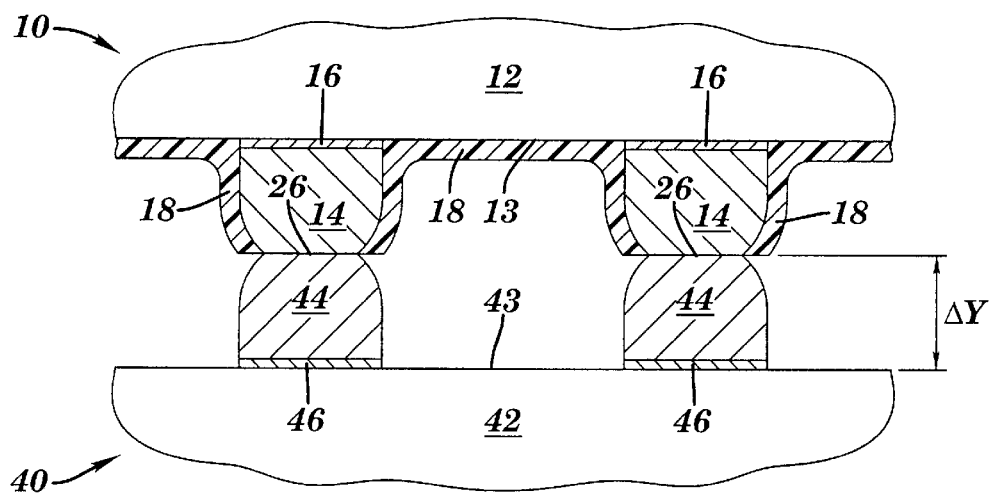
FIG. 7 depicts a front cross-sectional view of the first structure placed on the second structure, in accordance with the first preferred embodiment of the present invention.

In FIG. 7, the first structure 10 is shown as placed upon the second structure 40, such that each first conductive body 14 is placed on the corresponding conductive bump 44. The uncoated surface 26 of each first conductive body 14 may be formed in any suitable manner known in the art, such as by first coating all exposed surfaces of each first conductive body 14, and then removing a portion of the coating by such methods as laser ablation, grinding, or photolithography, as discussed supra for FIGS. 2, 3, or 4, respectively. Alternatively, each first conductive body 14 may be initially coated only partially, so as to form the associated uncoated surface 26 without necessitating subsequent removal of a portion of the initial coating. While each conductive bump 44 is shown as uncoated, the conductive bumps 44 may be optionally coated in accordance with the preceding discussion of FIG. 6.

Figure 8:
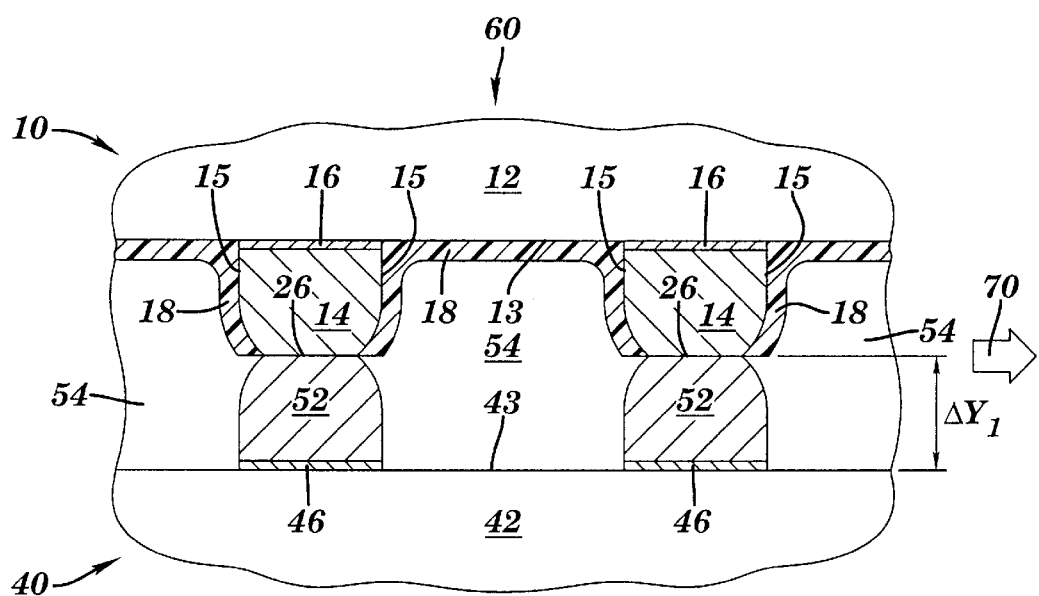
FIG. 8 depicts FIG. 7 after reflowing the conductive bumps of the second structure.

FIG. 8 shows the electrical structure 60 associated with completion of the process of the first preferred embodiment. The electrical structure 60 results from reflowing the conductive bumps 44 of FIG. 7 at a temperature at which the conductive bumps 44 melt and the first conductive bodies 14 do not melt. In practice, the reflow temperature should be high enough to reflect impurities that may be present in the conductive bumps 44 as well as the oven temperature variability. For example, impurities in the conductive bumps 44 may typically raise the melting point of the conductive bumps 44 by 20° C. or more and the oven temperature variability may be 10 to 15° C. Thus, if the conductive bumps 44 comprise a eutectic mixture of lead and tin, then the impurity-free melting point of about 183° C. implies a reflow temperature of at least about 215–220° C. to account for the aforementioned effects of impurities and oven temperature variability. A reflow temperature of about 220° C. is compatible with having the first conductive bodies 14 comprise a 90/10 lead/tin mixture which melts at 327 to 330° C., thereby assuring that the first conductive bodies 14 do not melt during reflow. Note that the reflow temperature must be sufficiently low that the coat of material 18 stays rigid during the reflow process. A polyimide, for example, typically stays rigid up to about 375° C. which is well above the reflow temperature of about 220° C. in the preceding example. It is also advantageous to reflow at a temperature as low as 220° C. when the second substrate comprises an organic chip carrier (e.g., a substrate including glass fiber impregnated with epoxy and having intervening copper layers) which can melt, and thus be destroyed, at temperature as low as about 245° C. In contrast, a ceramic chip carrier disintegrates at a much higher temperature (approximately 1370° C.). After reflow, the electrical structure 60 is cooled, resulting in solidification of the second conductive bodies 52. In the cooled electrical structure 60, each first conductive body 14 and the corresponding second conductive body 52 are mechanically and electrically coupled by surface adhesion at uncoated surface 26.

FIG. 8 shows a second conductive body 52 that is formed from each reflowed conductive bump 44. The height $\Delta Y_1$ of a second conductive body 52 in FIG. 8 is approximately equal to the height $\Delta Y$ of the corresponding conductive bump 44 in FIG. 7. The present invention seeks to maximize $\Delta Y_1$ in order to distribute thermal shear stresses and associated strains between the first substrate 12 and the second substrate 42, induced during thermal cycling, over as great an effective height as possible. There is a propensity of the reflowed conductive bump material 44 to adhere to the material of the first conductive bodies 14, rather than to the top surface 43 of the second substrate 42. With existing art, $\Delta Y_1$ is significantly less than $\Delta Y$, because the reflowed conductive bump material 44 redistributes itself along the surface 15 of the first conductive body 14. With the present invention, $\Delta Y_1$ does not significantly differ from $\Delta Y$, except for a small decrease due to sidewise motion of reflowed conductive bump material 44 in the direction 70, because of two related effects. First, the coat of material 18 prevents the reflowed conductive bump material 44 from adhering to the first conductive bodies 14, except at the uncoated surfaces 26. Second, the nonsolderability of the coat of material 18 prevents the reflowed conductive bump material 44 from adhering to the coat of material 18. The preceding two effects collectively prevent the conductive bump material 44 from flowing away from the location it occupied prior to the reflow. If there is a coating of material 48 (see FIG. 6) on a conductive bump 44, the coating of material 48 serves as a constraint on sidewise motion of the reflowed conductive bump material 44, which would increase $\Delta Y_1$ relative to when the coating of material 48 is absent, as discussed supra in conjunction with FIG. 6. The coat of material 18 in FIG. 8 further serves to prevent the reflowed conductive bump material 44 from contacting the pads 16, which is important if the conductive bump material 44 contains tin. Tin may attack the ball limiting metallurgy (BLM) of the pads 16 located at the perimeter of the first conductive bodies 14 when the pads 16 contain such materials as copper, chrome, and gold. A pad 16, if attacked by tin, is likely to cause the pad 16 to detach from the first substrate 12. The coat of material 18 may have any thickness, such as a half-mil thickness, that enables the coat of material 18 to serve the preceding purposes. The benefit of using the coat of material 18 may be enhanced if the surface area of the coat of material 18 exceeds the surface area of the uncoated surface 26 by a substantial factor such at least about 10.

Note that each second conductive body 52 is mechanically and electrically coupled to the corresponding first conductive body 14 by surface adhesion at uncoated surface 26. This feature, of no melting-induced fusion between a second conductive body 52 and the corresponding first conductive body 14, results from the fact that a first conductive body 14 does not melt while the corresponding conductive bump 44 is being reflowed.

Also shown in FIG. 8 is an optional encapsulating material 54, such as an epoxy anhydride with silica filler, which may be introduced into the space between the first substrate 12 and the second substrate 42. The encapsulating material 54 fills the space into which it is injected by a capillary action mechanism, and bonds to various surfaces, including both the first conductive bodies 14 and the second conductive bodies 52. The various surfaces to which the encapsulating material 54 bonds may be cleaned and surface roughened prior to the bonding, using standard techniques such as plasma treatment, to improve the bonding. As explained supra in the Related Art section, such encapsulating material mechanically couples the parts of the electrical structure 60 in such a way that the electrical structure 60 moves as one composite structure during thermal cycling; i.e., the encapsulating material 54 accommodates the thermal shear stresses. The effectiveness of the encapsulating material 54 for alleviating thermal stresses increases with increasing encapsulating material stiffness. The necessity for using the encapsulating material 54, however, increases as the separation distance between first substrate 12 and second substrate 42 increases. Utilizing the height of the second conductive bodies 52 to increase the separation diminishes the magnitude encapsulating material 54 stiffness needed, which reduces mechanical stresses on the on first conductive body 14 and the second conductive bodies 52 caused by the encapsulating material 54 itself. Additionally, reducing the stiffness of the encapsulating material increases the ability of the encapsulating material to absorb shock and vibration. Moreover, it may be possible to eliminate the encapsulating material 54 altogether if its height $\Delta Y_1$ is large enough to unilaterally keep thermal stresses at acceptable levels. Thus, the encapsulating material 54 either augments the role of $\Delta Y_1$ in mitigating thermal shear stresses or is not required. Omitting the encapsulating material 54 is desirable since the encapsulating material 54 inhibits the reworkability of the electrical structure 60 should a need arise to correct a problem during the life cycle and testing phases of the electrical structure 60, as explained supra in the Related Art section. Without the encapsulating material 54, the electrical structure 60 is easily reworkable. Reworkability may be accomplished in the present invention by heating the electrical structure 60 to a temperature that lies between the melting point of each first conductive body 14 and the melting point of each second conductive body 52, and then pulling the first structure 10 apart from the second structure 40. Each first conductive body 14 will easily separate from the corresponding second conductive body 52 with no damage, because each first conductive body 14 and the corresponding second conductive body 52 are merely surface bonded at uncoated surface 26. This is in contrast with the Somaki invention in which two solder bumps have been fused together, as explained supra in the Related Art section. In deciding whether to use encapsulating material, the user should weigh reworkability against enhanced thermal stress reduction.

By forming a substantial height $\Delta Y_1$ of the second conductive body 52, the first preferred embodiment of the present invention reduces unit thermal shear stresses, and associated strains, along the structural coupling path between the first substrate 12 and the second substrate 42, particularly at the pads 16 and 46 in FIG. 8. The thermal stresses occur during thermal cycling and are due to the CTE mismatch between the first substrate 12 and the second substrate 42. As stated previously, the first substrate 12 may comprise a chip or a module, while the second substrate 42 may comprise a chip carrier, module, or circuit card. A chip typically comprises silicon with a typical CTE of about 3 to 6 ppm/° C. An alumina chip carrier has a CTE of about 6 ppm/° C., while an organic chip carrier has a CTE in the range of about 6 to 24 ppm/° C. A circuit card typically has a CTE of about 14 to 22 ppm/° C. To overcome the effect of the CTE mismatch, $\Delta Y_1$ should be at least about 50% of the height of the first conductive body 14 (i.e., $\Delta Y$ in FIG. 7). A typical minimum value of $\Delta Y_1$ is about 3 mils.

Figure 9:
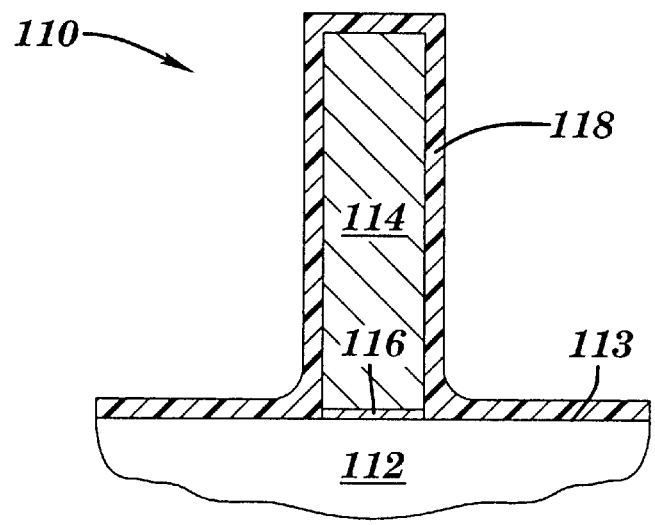
FIG. 9 depicts a front cross-sectional view of a first structure, in accordance with a second preferred embodiment of the present invention.

FIGS. 9–16 illustrate the process steps associated with a second preferred embodiment of the present invention. FIG. 9 depicts a front cross-sectional view of a first structure 110, which has a pad 116 on a top surface 113 of a first substrate 112. A first conductive body 114 is on the pad 116. The first substrate 112 may comprise a chip or a module. The first conductive body 114 may comprise a solder column, such as a C4 solder column. The first conductive body 114 comprises a suitable solder such as an alloy of lead and tin in such concentrations that the melting point of the alloy is above the melting point of the eutectic alloy. For example, the first conductive body 114 may have a lead/tin ratio of 90/10 by weight which has a melting point of about 327–330° C. In contrast, the eutectic lead/tin ratio of about 63/37 by weight has a melting point of about 183° C. The first conductive body 114 may have any suitable cylindrical shape and size. For example, the first conductive body 114 may be a circular cylinder with a height ranging from about 50 mils to about 87 mils, and a diameter ranging from about 20 mils to about 22 mils. This height is markedly greater than the height of the first conductive body 114 in the first embodiment of FIGS. 1–8. Although the effectiveness for alleviating thermal stresses increases as the height of the first conductive body 114 increases, any height in excess of the height of a standard C4 solder ball will improve thermal stress performance. While the preceding height/diameter ratios $\beta$ (e.g., 87/22, 50/20, etc.) of the first conductive body 114 are representative, both larger and smaller values of $\beta$ may be utilized. $\beta$ must not be so large as to compromise the ability of the first conductive body 114 to withstand mechanical stress, shock, and vibration. Accordingly, the upper limit to $\beta$ depends on such factors as the material of the first conductive body 114, the stiffness of encapsulating material if encapsulating material is used, and the temperatures to which the first conductive body 114 will be exposed during its lifetime. At the other extreme, a value of $\beta$ that is too low will limit the ability of the first conductive body 114 to move laterally (i.e., perpendicular to its height) and thus diminish the ability to alleviate thermal stresses. Accordingly a value of $\beta$ of about 1 or less may be too small to be effective in some applications. The actual lower limit of $\beta$ varies with the application and includes a dependence on the material of the first conductive body 114.

FIG. 9 shows the first conductive body 114, and the top surface 113, covered by a coat of material 118. The coat of material 118 comprises an unsolderable and nonconductive material such as a polyimide or a photosensitive resin. The coat of material 118 of the second preferred embodiment has the same properties and functionality, and may be formed by the same methods, as the coat of material 18 of the first preferred embodiment discussed supra for FIGS. 1–8. The top surface 113 and first conductive bodies 114 may be cleaned and surface roughened prior to forming the coat of material 118, using standard techniques such as plasma treatment, to improve the surface adhesion of the coat of material 118 to the top surface 113 and first conductive bodies 114.

Figure 10:
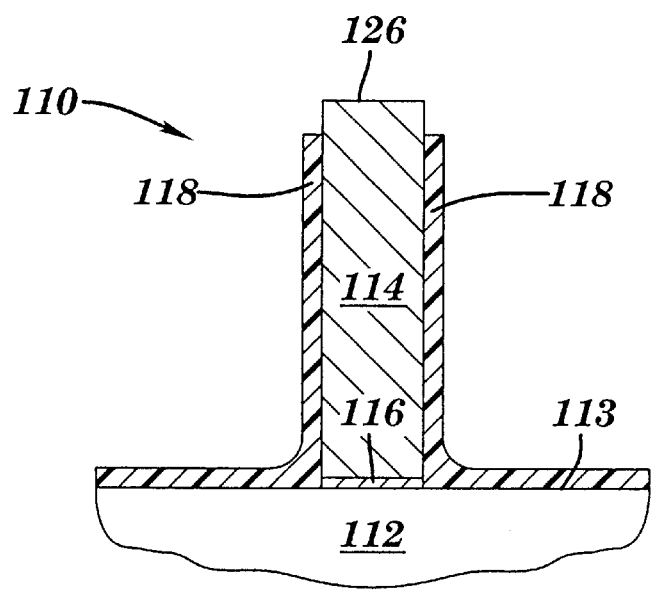
FIG. 10 depicts FIG. 9 after a portion of the coat of material of the first structure has been removed.

FIG. 10 shows the result of removing a portion of the coat of material 118 to form an uncoated surface 126. The removal of a portion of the coat of material 118 to form the uncoated surface 126 may be by any suitable method, such as laser ablation, grinding, and photolithography, as discussed supra in conjunction with FIGS. 2, 3, and 4, respectively, for the first preferred embodiment. The uncoated surface 126 may be cleaned and surface roughened, using standard techniques such as plasma treatment, to improve the subsequent surface adhesion with conductive bump 144, as will be discussed infra for FIGS. 15–16.

Figure 11:
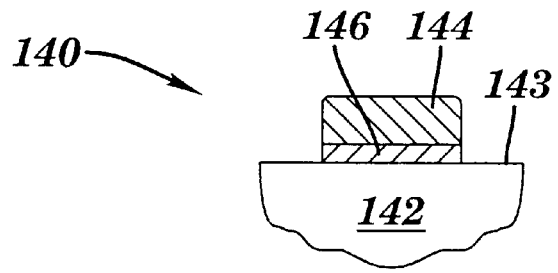
FIG. 11 depicts a front cross-sectional view of a second structure, in accordance with the second preferred embodiment of the present invention.

FIG. 11 depicts a front cross-sectional view of a second structure 140, which has a pad 146 on a top surface 143 of a second substrate 142. A conductive bump 144, such as a C4 eutectic solder bump in the form of a pre-cleaned solder ball, is on the pad 146. If the first substrate 112 of FIG. 9 comprises a chip, then the second substrate 142 may comprise a chip carrier or a circuit card. If the first substrate 112 of FIG. 9 is a module, then the second substrate 142 may comprise a circuit card. The melting point of the conductive bump 144 is below the melting point of the first conductive body 114 (see FIG. 9). For example, if the first conductive body 114 comprises a lead/tin alloy of 90/10 composition by weight (melting point 327–330° C.), the conductive bump 144 may comprise the eutectic 63/37 lead/tin alloy (melting point 183° C.), with a consequential melting point differential of approximately 150° C. It is also within the scope of the present invention for the conductive bump 144 to comprise an alloy of a composition that has a melting point above the eutectic melting point. In this regard, the respective melting points of the conductive bump 144 and the first conductive body 114 must be related such that the conductive bump 144 and the first conductive body 114 may be heated to a common temperature at which the conductive bump 144 melts and reflows while the first conductive body 114 remains solid. The conductive bump 144 may be any suitable shape and size, such as a truncated spherical shape with a diameter of 1 to 40 mils.

Figure 12:
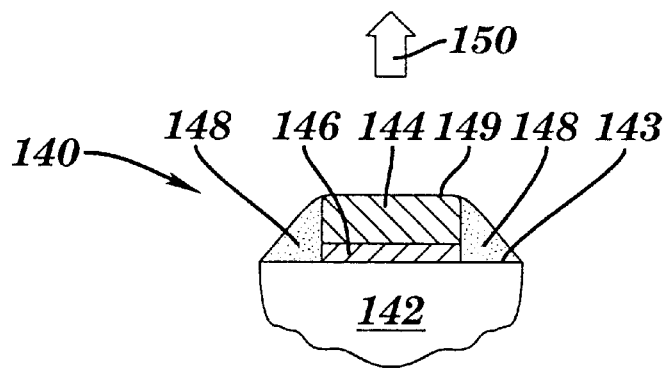
FIG. 12 depicts FIG. 11 with a coat of material on the conductive bump of the second structure.

FIG. 12 shows the conductive bump 144, and the top surface 143, covered by a coating of material 148, such as cured photosensitive resin. In FIG. 12, the uncoated surface 149 of the conductive bump 144 may be formed by any of the methods by which the uncoated surface of the first conductive body 114 (see FIG. 9) is formed, such as laser ablation, grinding, and photolithography as discussed previously. The top surface 143 may be cleaned and surface roughened prior to forming the coating of material 148, using standard techniques such as plasma treatment, to improve the surface adhesion of the coat of material 148 to the top surface 143. The coating of material 148 in FIG. 12 is optional and serves to constrain the conductive bump material 144 to move, upon being reflowed, in an approximately upward direction, rather than in a sidewise direction, as denoted by direction arrow 150.

Figure 13:
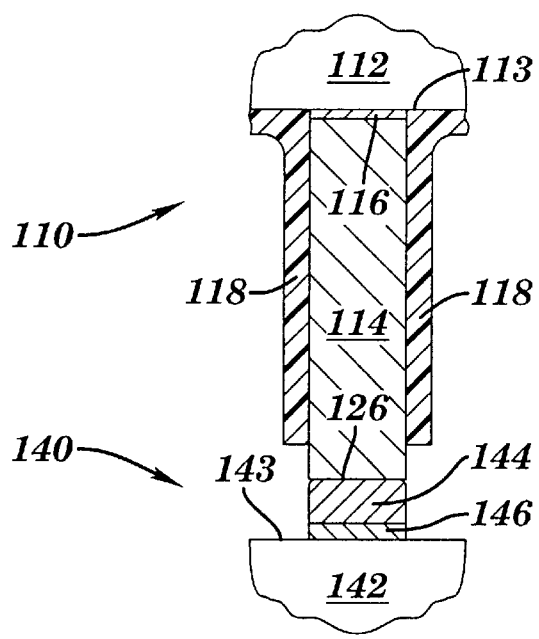
FIG. 13 depicts a front cross-sectional view of the first structure placed on the second structure, in accordance with the second preferred embodiment of the present invention.
Figure 14:
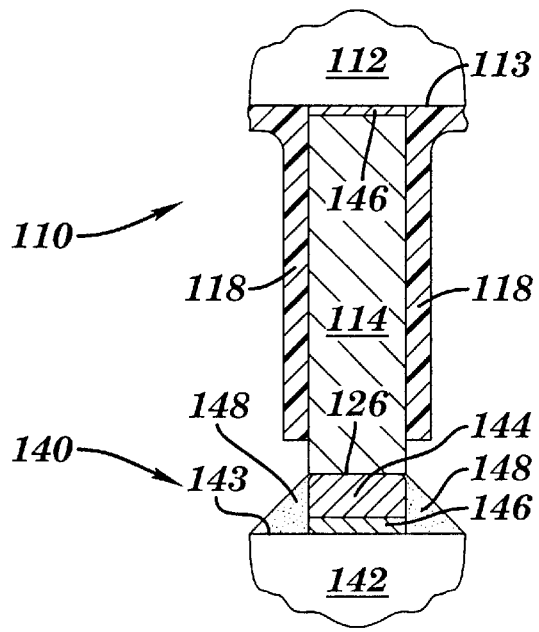
FIG. 14 depicts FIG. 13 with the addition of a coating of material.

In FIG. 13, the first structure 110 is shown as placed upon the second structure 140, such that the first conductive body 114 is placed on the conductive bump 144. The uncoated surface 126 of the first conductive body 114 may be formed in any suitable manner known in the art, such as by first coating all exposed surfaces of the first conductive body 114, and then removing a portion of the coating by such methods as laser ablation, grinding, or photolithography, as discussed supra for FIGS. 2, 3, or 4, respectively, for the first preferred embodiment. Alternatively, the first conductive body 114 may be initially coated only partially, so as to form the uncoated surface 126 without necessitating subsequent removal of a portion of the initial coating. While the conductive bump 144 is shown as uncoated, the conductive bump 144 may be optionally coated in accordance with the preceding discussion of FIG. 12. Accordingly, FIG. 14 depicts FIG. 13 with the addition of the coating of material 148 of FIG. 12.

Figure 15:
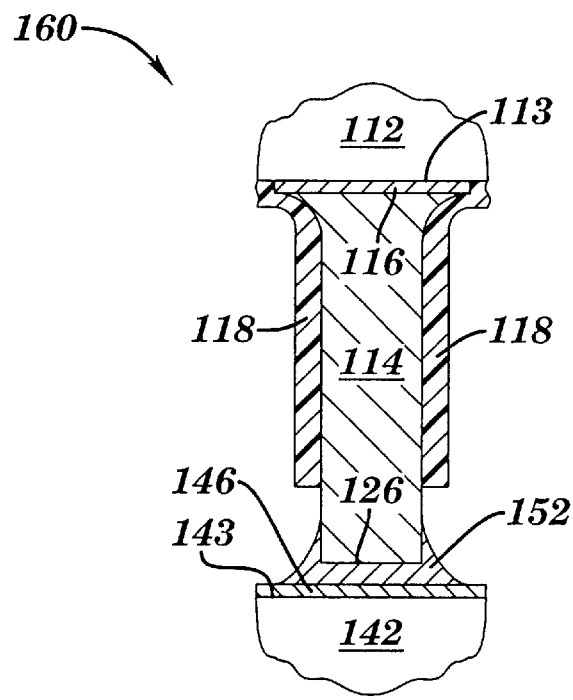
FIG. 15 depicts FIG. 13 after reflowing the conductive bump of the second structure.

FIG. 15 shows the electrical structure 160 associated with completion of the process of the second preferred embodiment. The electrical structure 160 results from reflowing the conductive bump 144 of FIG. 13 (or FIG. 14 if coating of material 148 is present) at a temperature at which conductive bump 144 melts and the first conductive body 114 does not melt. In practice, the reflow temperature should be high enough to reflect impurities that may be present in the conductive bump 144 as well as the oven temperature variability, in accordance with the considerations mentioned in the previous discussion of FIG. 8 for the first preferred embodiment. After reflow, the electrical structure 160 is cooled, resulting in solidification of the second conductive body 152. In the cooled electrical structure 160, the first conductive body 114 and the second conductive body 152 are mechanically and electrically coupled by surface adhesion at the uncoated surface 126.

FIG. 15 shows a second conductive body 152 that is formed from the reflowed conductive bump 144 of FIG. 12. The reflowed conductive bump material 144 has a propensity to adhere to the material of the first conductive body 114, rather than to the top surface 143 of the second substrate 142. Thus, the coat of material 118 serves several purposes. The coat of material 118 prevents the reflowed conductive bump material 144 from adhering to the first conductive body 114, except at the uncoated surface 126. The nonsolderability of the coat of material 118 serves to prevent the reflowed conductive bump material 144 from adhering to the coat of material 118. The coat of material 118 further serves to prevent the reflowed conductive bump material 144 from contacting the pad 116, which is important if the conductive bump material 144 contains tin, as discussed supra in conjunction with FIG. 8. The coat of material 118 may have any thickness, such as a half-mil thickness, that enables the coat of material 118 to serve the preceding purposes. The benefit of using the coat of material 118 may be enhanced if the surface area of the coat of material 118 exceeds the surface area of the uncoated surface 126 by a substantial factor such at least about 10.

Note that the second conductive body 152 is mechanically and electrically coupled to the first conductive body 114 by surface adhesion at the uncoated surface 126. This feature, of no melting-induced fusion between the second conductive body 152 the first conductive body 114, results from the fact the first conductive body 114 does not melt while the conductive bump 144 is being reflowed.

The substantial height the first conductive body 114 substantially reduces unit thermal shear stresses, and associated strains, along the structural coupling path between the first substrate 112 and the second substrate 142, particularly at the pads 116 and 146 in FIG. 15. The thermal stresses occur during thermal cycling are due to the CTE mismatch between the first substrate 112 and the second substrate 142, in conjunction with the same ranges of CTE for the first substrate 112 and second substrate 142 as were discussed supra for the first substrate 12 and second substrate 42 in FIG. 8. Since the substantial height of the first conductive body 114 generates the desired thermal stress reductions, the electrical structure 160 does not depend on the height of the second conductive body 152 for reducing thermal shear stresses. Additionally, encapsulating material such as the encapsulating material 54 discussed supra in connection with FIG. 8, is not needed for thermal stress reduction, because of the effectiveness of the substantial height the first conductive body 114 in reducing the thermal stresses.

Figure 16:
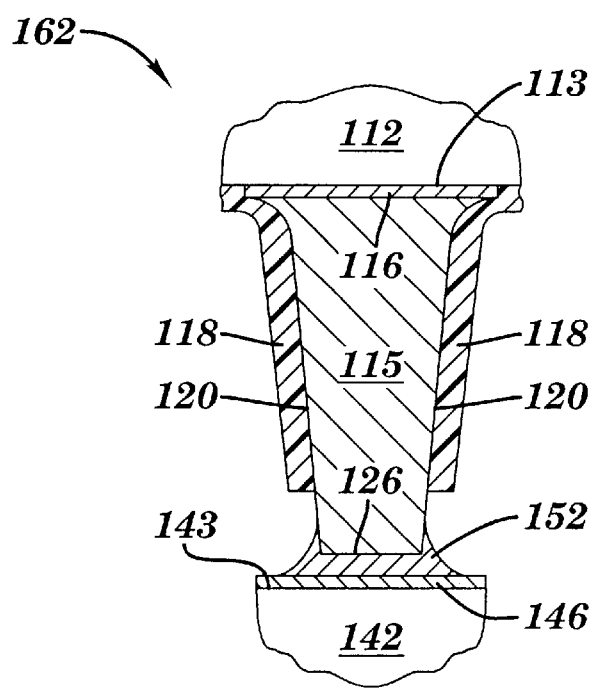
FIG. 16 depicts FIG. 15 with a tapered first conductive body replacing the first conductive body.

FIG. 16 illustrates FIG. 15 with the first conductive body 114 being replaced with a tapered first conductive body 115 having a lateral surface 120 in the form of a straight-edged taper, resulting in the electrical structure 162. The tapering may facilitate an easier fabrication of the first conductive body 115. The first conductive body 115 may be fabricated by injection molding, which injects liquified first conductive body material under pressure into a mold, such as a steel mold, followed by solidification upon cooling. As the solidified first conductive body material is removed from the mold, frictional contact by the first conductive body 115 with the inner mold surface may damage the first conductive body material. A higher incidence of such damage may occur with the cylindrical-shaped first conductive body 114 of FIG. 15 than with the tapered first conductive body 115 of FIG. 15, since the first conductive body 114 maintains the frictional contact until the first conductive body 114 clears the mold. In contrast, a mere tapping of the tapered first conductive body 115 decouples the frictional contact between the tapered first conductive body 115 and the mold.

FIGS. 17–22 illustrate a process for forming a solder column structure, in accordance with a third preferred embodiment of the present invention. This process forms a first conductive body having a tapered or hourglass shape, in analogy with the first conductive body 115 of FIG. 16. The first conductive body formed by this process may be used as the first conductive body 114 of FIGS. 9–10 and 13–15, or the first conductive body 115 of FIG. 16. FIGS. 17–19 and 20–22 respectively illustrate alternate methods of accomplishing the process of the third preferred embodiment.

Figure 17:
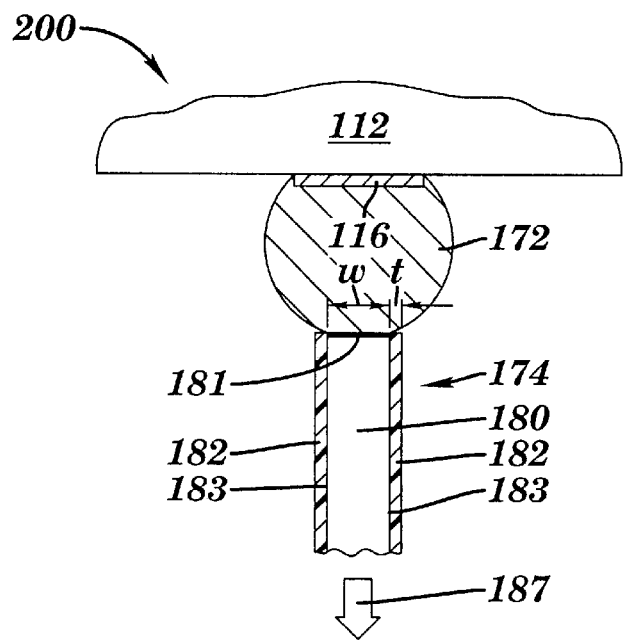
FIG. 17 depicts a top view of a solder body structure with a pin, in accordance with a third preferred embodiment of the present invention.

FIG. 17 illustrates the step of providing a solder body structure 200, comprising the substrate 112 having the attached pad 116, a solder body 172 in contact with the pad 116, and a retractable body 174 in contact with the solder body 172. The substrate 112 may include such devices as a chip or a module. The solder body 172 includes a solid solder mass made of the same material as that of the first conductive body 114 of FIGS. 9–10 and 13–15, or the first conductive body 115 of FIG. 16 (e.g. lead/tin solder in a 90/10 ratio by weight). The retractable object 174 in FIG. 17 comprises a pin 180 and an unsolderable sleeve 182. The pin 180 includes a solderable surface 181 and a lateral surface 183. The unsolderable sleeve 182 surrounds the pin 180 and is in contact with the pin 180 at the lateral surface 183. The retractable object 174 is in contact with the solder body 172 at the solderable surface 181. The pin 180 may include a solderable material, such as copper, nickel, or steel. The unsolderable sleeve 182 may include an unsolderable material, such as a polyimide, a photoimageable epoxy material, or chrome. The pin 180, and the unsolderable sleeve 182, each have a melting point higher than the melting point of the solder body 172.

A heating step heats the solder body structure 200 to a final temperature above the melting point of the solder body 172 and below the melting point of the pin 180 and of the unsolderable sleeve 182. The heating step may be accomplished, inter alia, by placing the solder body structure 200 in an oven and heating the oven. The heating melts the solder body 172, causing the solder body 172 to be solderably connected to the pin 180 at the solderable surface 181, and also to the pad 116. The unsolderable sleeve 182 serves to prevent melted solder from adhering to the lateral surface 183 of the pin 180. Thus, if the lateral surface 183 of the pin 180 is unsolderable, then the unsolderable sleeve 182 is unnecessary and may be eliminated. If, for example, the pin 180 is made of an unsolderable material with a sufficiently high melting point, such as aluminum or chrome, and capped with a thin adherent layer of solderable material, such as copper, that includes the solderable surface 181, then there is no need for the unsolderable sleeve 182.

Figure 18:
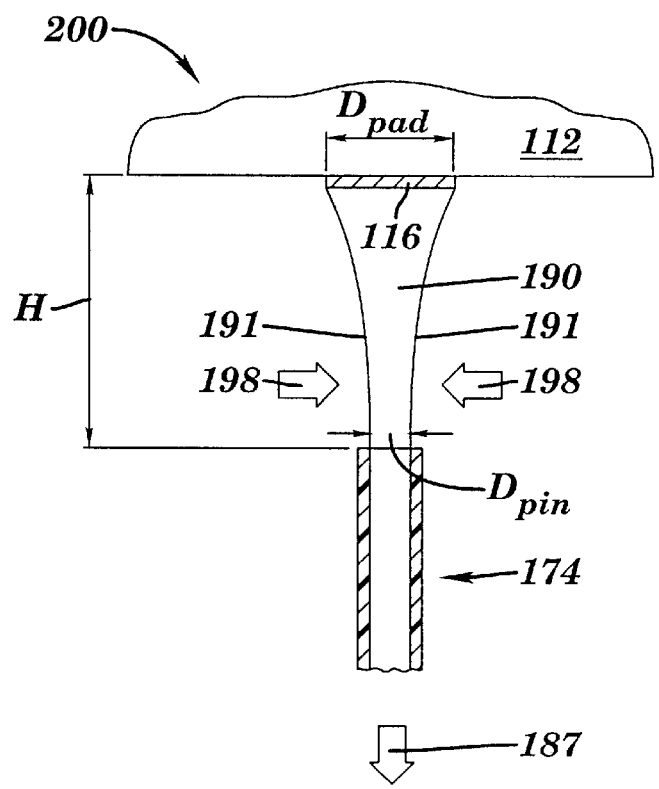
FIG. 18 depicts FIG. 17 after the solder body structure has been heated and the pin has been retracted.

After the heating step, the step performed is moving the retractable object 174 away from the pad 116 in the direction 187 while the solder body 172 remains solderably connected to both the both pad 116 and the solderable surface 181, until a solder column is formed from the solder body 172. The resultant solder column 190 is shown in FIG. 18. The speed and acceleration of the retractable object 174 must be controlled so as to enable the solder body 172 to maintain the aforementioned solder connections. The curvature of the tapered edge 191, in FIG. 18, of the solder column 190 is less susceptible to thermal and mechanical stresses than would be a straight-edged tapered surface. The curvature of the tapered edge 191 of the solder column 190 is caused by surface tension at the edge 191, which pulls melted solder at the edge 191 in the radially inward direction 198. The details of the curvature of the edge 191 includes a dependence on the surface tension characteristics of the particular material used for the solder column 190, and on relative values of geometric factors such as the height of the solder column (H), the lateral extent of the solder column at the pad 116 ($D_{pad}$), and the lateral extent of the solder column at the solderable surface 181 of the pin 116 ($D_{pin}$). The tapering of the edge 191 in FIG. 18 is a consequence of $D_{pin}/D_{pad}<<1$. In contrast, the edge in FIG. 21, described infra, shows an hourglass-shaped edge 193 as a consequence of a relationship analogous to $D_{pin} \approx D_{pad}$. For fixed values of $D_{pad}$ and $D_{pin}$, the radius of curvature of the edge 191 increases as H increases. Accordingly, the edge 191 approaches a straight-line edge similar to surface 120 in FIG. 16 as H becomes sufficiently large. The maximum attainable value of H is limited by the amount of material in the solder body 172 of FIG. 17. The ratio $D_{pin}/D_{pad}$ is a positive number that has an upper limit of at least 1. Similarly the ratio (R) of the area of the solderable surface 181 to the area of pad 116 is a positive number that has an upper limit of at least 1. The upper limit to $D_{pin}/D_{pad}$, as well as the preceding upper limits on R and H, is governed by the spacing between adjacent pads 116 on the substrate 112, since the solder bodies 180 on adjacent pads 116 must remain insulatively separated; otherwise electronic structures on adjacent pads 116 may become electrically shorted.

After the solder column 190 is formed, a cooling of the solder column 190 is accomplished by any suitable method. A method of cooling the solder column 190 includes transferring the solder body structure from the oven to a cooler environment such as a room-temperature environment. Another method of cooling the solder column 190 includes removing the heat source, such as by "turning off" the oven, and allowing the solder column 190 to cool off without being substantially moved.

Figure 19:
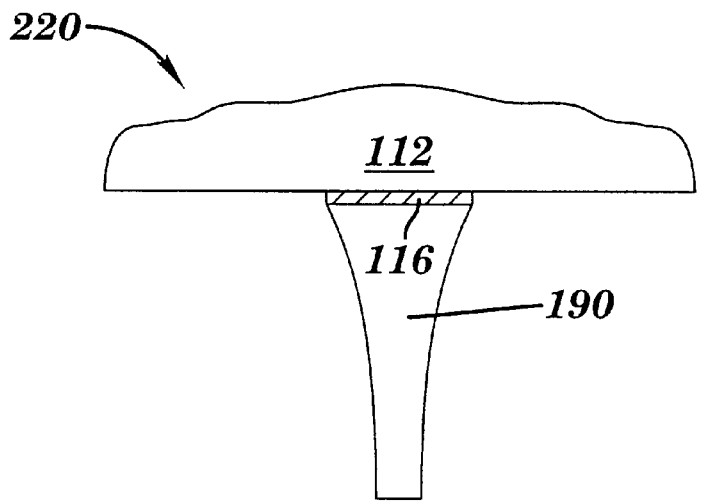
FIG. 19 depicts FIG. 18 after the pin has been detached and removed.

The final step is detaching the retractable object 174 from the solder column 190 after the solder column 190 has solidified. The detaching step may be accomplished by mechanically pulling the retractable object 174 from the solder column 190 when the temperature is slightly below the melting temperature of the solder column 190 (e.g., no more than about 15° C. below the melting temperature of the solder column 190). The resulting solder column structure 220 is shown in FIG. 19.

Figure 20:
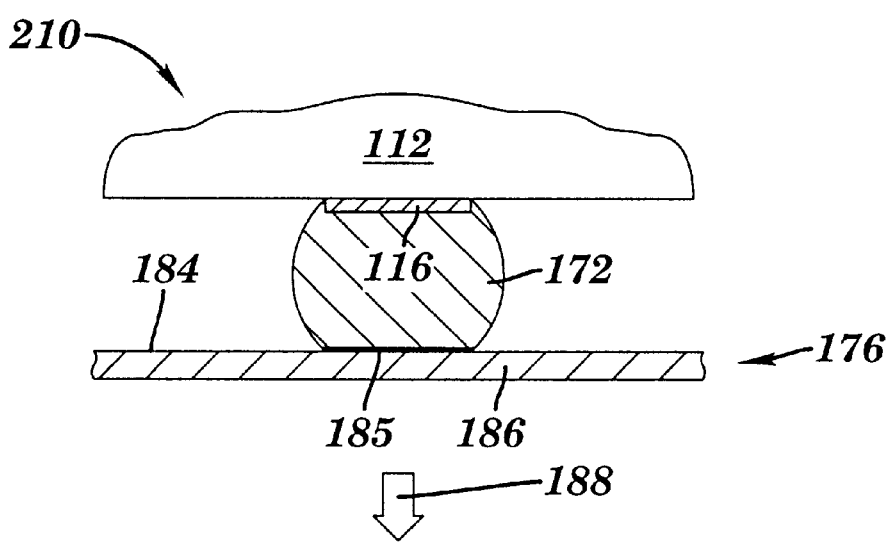
FIG. 20 depicts FIG. 17 with the pin replaced by a plate.
Figure 21:
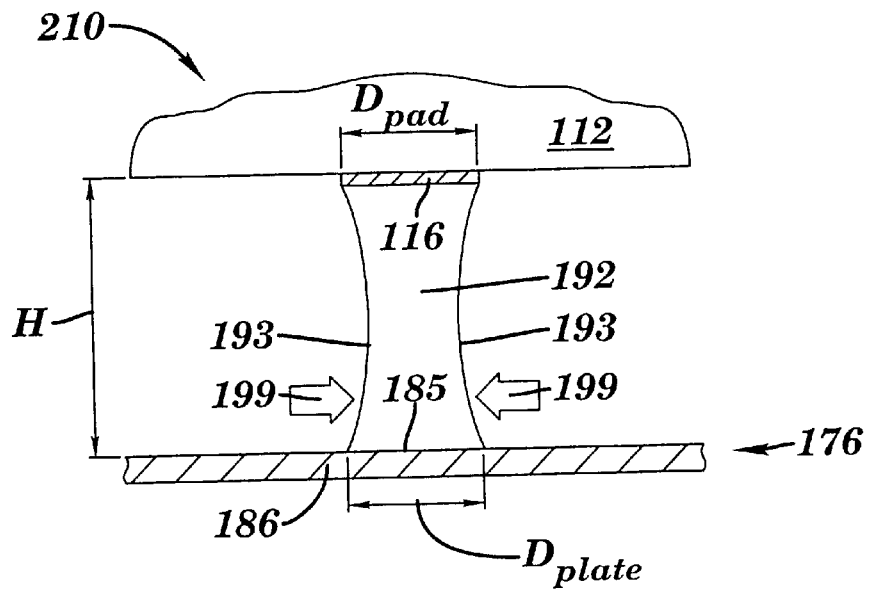
FIG. 21 depicts FIG. 20 after the solder body structure has been heated and the plate has been retracted.
Figure 22:
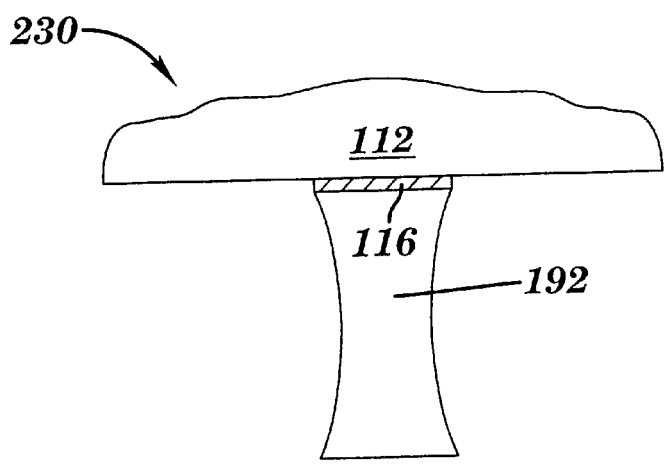
FIG. 22 depicts FIG. 21 after the plate has been detached and removed.

FIGS. 20–22 illustrate the process of the third preferred embodiment for the solder body structure 210. FIGS. 20–22 are analogous to FIGS. 17–19, described supra, for the process with solder body structure 200. A primary configurational difference is that the retractable object 174 comprising the pin 180 in FIG. 17 is replaced by the retractable object 176 comprising the plate 186 in FIG. 20. The plate 186 includes a solderable surface 185 which is analogous to the solderable surface 181 of pin 180 in FIG. 17, and an unsolderable surface 184. The foregoing surface configuration of the plate 186 could be formed by standard methods, such as by covering a copper plate with photoimageable material, selective photoexposing (via mask-protecting the solderable surface 185 locations) the plate 186 surfaces to ultraviolet radiation, and developing away the unexposed photoimageable material to uncover the copper at the solderable surface 185 such that the photoexposed surface constitutes the unsolderable surface 184. Another method of forming the plate 186 is by depositing a solderable metal on a plate made of unsolderable material having a high melting point. Many materials may qualify as the material of the plate of unsolderable material, such as aluminum or chrome. The solderable metal may include, for example, copper. The solderable metal may be deposited on the unsolderable plate at the solderable surface 185 location by any known process, such as by sputtering. The melting point of the plate 186 should exceed the melting temperature of the solder body 172.

A distinction relating to the plate 186 is that a single plate 186 with multiple solderable surfaces 185 can be used for a substrate with corresponding multiple pads 116. In contrast, multiple pins 180 in FIG. 17 would be needed for a substrate with corresponding multiple pads 116.

The step of heating the solder body structure 210 in FIG. 20 is analogous to the step of heating the solder body structure 200 in FIG. 17. As with the unsolderable sleeve 182 of FIG. 17, the unsolderable surface 184 does not solderably connect with the melted solder of the solder body 172, which prevents the melted solder from leaving the solder body 172. The melted solder of the solder body 172 causes the solder body 172 to solderably connect with the plate 186 at the solderable surface 185.

After the heating step, a performed step is moving the retractable object 176 away from the pad 116 in the direction 188 while the solder body 172 remains solderably connected to both the pad 116 and the solderable surface 185, until a solder column is formed from the solder body 172. The resultant solder column 192 is shown in FIG. 21. The speed and acceleration of the retractable object 176 must be controlled so as to enable the solder body 172 to maintain the aforementioned solder connections. The curvature of the hourglass-shaped edge 193 of the solder column 192 is less susceptible to thermal and mechanical stresses than would be a straight-edged tapered surface. The curvature of the hourglass-shaped edge 193 of the solder column 192 is caused by surface tension at the edge 193 which pulls melted solder at the edge 193 in the radially inward direction 199. The details of the curvature of the edge 193 includes a dependence on the surface tension characteristics of the particular material used for the solder column 192, and on relative values of geometric factors as explained supra in the corresponding discussion of geometric factors associated with FIG. 18. In particular, the edge 193 has an hourglass shape instead a tapered shape, because the geometric relationship $D_{plate} \approx D_{pad}$ is satisfied (see FIG. 21 for definitions of $D_{plate}$ and $D_{pad}$). It should be noted that the edge 191 of FIG. 18 and the edge 193 of FIG. 21 may each have a tapered shape (curved or straight) or an hourglass shape, in accordance with the relationships between H, $D_{pad}$, and $D_{pin}$ in FIG. 18, and the relationships between H, $D_{pad}$, and $D_{plate}$ in FIG. 21, as discussed supra. The ratio $D_{plate}/D_{pad}$ is a positive number that has an upper limit of at least 1, in accordance with the analogous discussion for FIG. 18 of an upper limit to $D_{pin}/D_{pad}$. Similarly the ratio ($R_1$) of the area of the solderable surface 185 to the area of pad 116 is a positive number that has an upper limit of at least 1. Constraints on $R_1$, and on solder column height H in FIG. 21, are the same as those discussed infra for R and H, respectively, for FIG. 18.

After the solder column 192 is formed, a cooling of the solder column 192 is accomplished by any suitable method, such as those discussed supra for the cooling step of FIG. 18.

The final step of detaching the retractable object 176 from the solder column 192 is accomplished after the solder column 192 has solidified. This detaching step may be accomplished by chemically removing any portion of the metal plate 186 that includes the solderable surface 185, which eliminates the bonding between the solder column 192 and the metal plate 186. Any remaining amount of the metal plate 186 after the chemical removal may be mechanically withdrawn. The resulting solder column structure 230 is shown in FIG. 22.

While preferred and particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

We claim:

1. An electrical structure, comprising:
   a first substrate;
   a first conductive body mechanically and electrically coupled to the first substrate;
   a nonsolderable and nonconductive coating material, wherein a portion of a surface of the first conductive body is coated by the nonsolderable and nonconductive coating material such that an uncoated surface of the first conductive body remains, and wherein a portion of a surface of the first substrate is coated by the nonsolderable and nonconductive coating material; p1 a second conductive body mechanically and electrically in direct contact with the first conductive body by surface adhesion between a surface of the second conductive body and the uncoated surface of the first conductive body, wherein a melting point of the second conductive body is less than a melting point of the first conductive body, and wherein the coating material is rigid Lit a temperature that is equal to the melting point of the first conductive body;
   a second substrate mechanically arid electrically coupled to the second conductive body; and
   an encapsulating material between the first substrate and the second substrate, wherein the encapsulating material encapsulates the first conductive body and the second conductive body, wherein the encapsulating material is in direct mechanical contact with the second conductive body, and wherein the encapsulating material is in direct mechanical contact with the second substrate.

2. The electrical structure of claim 1, wherein the first conductive body includes a solder bump.

3. The electrical structure of claim 2, wherein a height of the second conductive body is at least about 50% of a height of the solder bump.

4. The electrical structure of claim 2, wherein an area of the coated surface of the first conductive body exceeds an area of the uncoated surface of the first conductive body by a factor of at least about 10.

5. The electrical structure of claim 1, wherein the first conductive body includes a solder column.

6. The electrical structure of claim 5, wherein a height of the solder column is at least about 50 mils, and wherein the solder column has a height/diameter ratio of at least about 2.5.

7. The electrical structure of claim 5, wherein the second conductive body covers less than about 10% of an outer surface of the solder column.

8. The electrical structure of claim 5, wherein the solder column is tapered.

9. The electrical structure of claim 5, wherein the solder column is tapered with a curved edge.

10. The electrical structure of claim 5, wherein the solder column includes an hourglass shape.

11. The electrical structure of claim 1, wherein the second substrate includes an organic material.

12. The electrical structure of claim 1, wherein the second substrate includes a ceramic material.

13. The electrical structure of claim 1, further comprising a second nonsolderable and nonconductive coating material, wherein a portion of a surface of the second conductive body is coated by the second nonsolderable and nonconductive coating material, and wherein a remaining uncoated surface of the second conductive body is in mechanical adhesion and electrical contact with the uncoated surface of the first conductive body.

14. The electrical structure of claim 13, wherein the second nonsolderable and nonconductive coating material includes a polyimide.

15. The electrical structure of claim 13, wherein the second nonsolderable and nonconductive coating material includes a cured light-sensitive resin.

16. The electrical structure of claim 1, wherein a height of the second conductive body is at least about 3 mils.

17. The electrical structure of claim 1, wherein the nonsolderable and nonconductive material includes a polyimide.

18. The electrical structure of claim 1, wherein the encapsulating material includes epoxy anhydride with silica filler.

19. The electrical structure of claim 1, wherein the molting point of first conductive body exceeds the molting point of the second conductive body by no more than about 147° C.

20. The electrical structure of claim 1, wherein the second conductive body includes a lead and tin in a eutectic lead/tin ratio.

21. The electrical structure or claim 1, wherein the second conductive body includes a lead and tin in lead/tin ratio that exceeds a eutectic lead/tin ratio.

22. The electrical structure of claim 1, wherein the first substrate includes a chip, and wherein the second substrate includes a chip carrier or a circuit card.

23. The electrical structure of claim 1, wherein the first substrate includes a chip or a module, and wherein the second substrate includes a circuit card.

24. The electrical structure of claim 1, wherein the coating material is rigid at a temperature that is 35° C. greater than the melting point of the first conductive body.

25. The electrical structure of claim 1, wherein the coating material is rigid at a temperature of 375° C.

26. The electrical structure of claim 1, wherein the first conductive body has a first exterior surface and a second exterior surface opposite the first exterior surface, wherein the first conductive body is mechanically and electrically coupled to the first substrate at the first exterior surface, and wherein the first conductive body is mechanically and electrically coupled to the first substrate at the second exterior surface.

* * * * *